June 27, 1967 SUKEHIRO ITO ETAL 3,328,713

PUSH-PULL AMPLIFIER OPERATED WITH ONE INPUT

Filed April 24, 1964 2 Sheets-Sheet 1

Inventor

S. ITO - Y. UENO - H. KASHIWAGI

By [signature]

Attorney

PUSH-PULL AMPLIFIER OPERATED WITH ONE INPUT

INVENTORS
SUKEHIRO ITO
YOSHITO UENO
HIROSHI KASHIWAGI

United States Patent Office 3,328,713

Patented June 27, 1967

3,328,713

PUSH-PULL AMPLIFIER OPERATED WITH ONE INPUT

Sukehiro Ito, Yoshito Ueno, and Hiroshi Kashiwagi, Minato-ku, Tokyo, Japan, assignors to Nippon Electric Company, Limited, Tokyo, Japan, a corporation of Japan Filed Apr. 24, 1964, Ser. No. 362,291
Claims priority, application Japan, May 8, 1963, 38/24,579
17 Claims. (Cl. 330—15)

This invention relates to a transistor output amplifier of the push-pull type.

In a transistor amplifier, variations of the emitter current cause variations in the amplification factor of the transistor and in the emitter resistance. As a result, the amplified output current is distorted non-linearly with respect to the input signal. In order to reduce such non-linear distortion, prior art push-pull amplifiers generally utilized a combination of two n-p-n transistors, two p-n-p transistors, or an n-p-n and a p-n-p transistor. It is, however, very difficult for a push-pull amplifier comprising said combination of an n-p-n and a p-n-p transistor, to select a set of transistors which are completely complementary and have symmetric characteristics with respect to each other. While, it is not too difficult to obtain two transistors of the same conduction type which have the same characteristics, it should be noted that such a push-pull amplifier is inadequate for use in wide-band amplification of television video signals and the like because the transformer which has to be used therein as a phase-splitter and output circuit is very high-priced, if a well balanced transformer is desired. Additionally, such a transformer has a relatively narrow band width.

An object of the invention therefore is to provide a wide-band push-pull amplifier having substantially no second-order distortion.

This invention provides a transistor amplifier which includes a direct-current power source for providing substantially direct-current electric power and a pair of transistors which may both have the same conductivity or which may have opposite conductivities. A signal source having an internal impedance $R_s$ is provided for supplying a signal current to the base of the first transistor and an external emitter impedance having an impedance $R_x$ is interposed between the emitter of the first transistor and one of the terminals of the power source. Two resistors respectively having resistances $R_1$ and $R_2$ are serially connected between the collector of the first transistor and the emitter of the second transistor such that $R_L$ is connected to the junction between said two resistors. Means are provided for connecting the collector of the second transistor to the remaining terminals of the power source. A coupling impedance circuit which exhibits a small impedance in response to the signal current of the signal source and a large impedance in response to a direct current is interposed between the base of the second transistor and the collector of the first transistor. Additionally bias means having a large impedance are provided for supplying bias voltages to said transistors, said bias means being connected to the bases of the first and the second transistors, respectively. If the base and emitter resistance of the transistors are designated respectively $r_{b1}$ and $r_{b2}$ and $r_{e1}$ and $r_{e2}$, and if the first derivatives $r_{e1'}$ and $r_{e2'}$ of said emitter resistances are functions of the respective collector currents and if the current amplification factors for the first and the second transistors are designated $B_1$ and $B_2$ and if the first derivatives $B_1'$ and $B_2'$ of the amplification are functions of the respective collector currents then the resistances $R_1$ and $R_2$, and the impedances $R_x$ and $R_s$ can be selected to satisfy (when both signal components of the collector currents are zero) Equations A and B below:

$$R_2+r_{e2}+r_{b2}/(B_2+1)=R_1(B_2-1)/(B_2+1) \qquad (A)$$

$$\begin{aligned}2[B_1'(R_s+r_{b1}+(B_1+1)(r_{e1}+R_x))\\ -B_1((B_1+1)r_{e1}'+(r_{e1}+R_x)B_1')]\\ \div[R_s+r_{b1}+(B_1+1)(r_{e1}+R_x)]\\ =B_1R_1[(R_1+r_{b2}+(B_2+1)(r_{e2}+R_2))B_2'\\ -B_2((B_2+1)r_{e2'}+(r_{e2}+R_2)B_2')]\\ \div[R_1+r_{b2}+(B_2+1)(r_{e2}+R_2)]^2 \qquad (B)\end{aligned}$$

The above-mentioned and other features and objects of this invention and the means of attaining them will become more apparent and the invention itself will be best understood by reference to the following description of embodiments of the invention taken in conjunction with the accompanying drawings in which.

Figure 1:
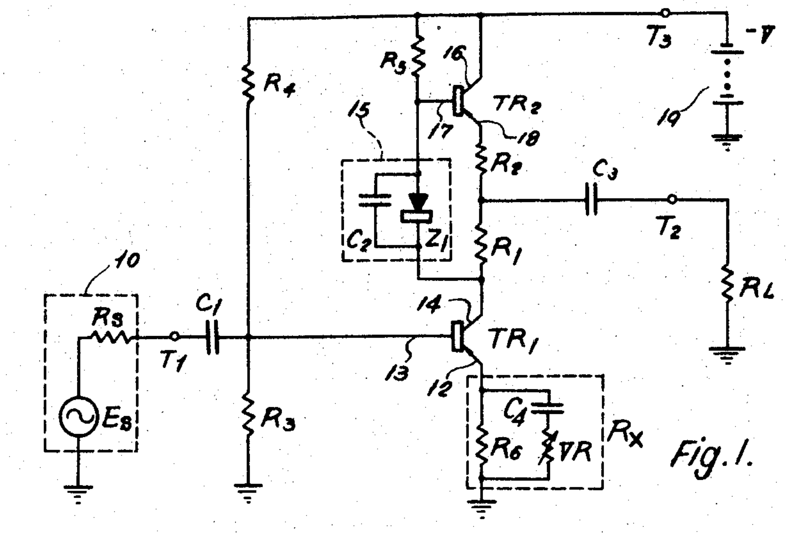
FIGURE 1 is a circuit diagram of one embodiment of the invention using p-n-p transistors.

Referring to FIGURE 1, the signal source 10 of the amplifier has an internal impedance $R_s$ and provides an output voltage $E_s$. Source 10 is connected through input terminal $T_1$ and a coupling capacitor $C_1$ to the base 13 of the p-n-p transistor $TR_1$ whose emitter 12 is grounded. The amplified output signal from transistor $TR_1$ flows from its collector 14, through a resistor $R_1$ connected thereto and a coupling capacitor $C_3$, to the output terminal $T_2$. Meanwhile, a portion of the output signal current supplied from the collector 14 is applied through a coupling circuit 15 (composed of a Zener diode $Z_1$ and a by-pass capacitor $C_2$ connected in parallel) for providing a bias voltage to the base 17 of a p-n-p transistor $TR_2$ whose collector 16 is grounded through D.C. source 19. The amplified output current of the transistor $TR_2$ flows through resistor $R_2$ (connected to the emitter 18) and the coupling capaictor $C_3$, to the output terminal $T_2$. The two resistors $R_3$ and $R_4$ are provided to maintain the desired direct-current working point for the transistor $TR_1$. These resistors have sufficiently high resistances, as compared with the alternating-current impedance of the transistor input circuit, to insure that at most only a tiny fraction of the signal current will flow through the resistances $R_3$ and $R_4$. The resistor $R_5$ is provided to supply the base current of the transistor $TR_2$ as well as the current for the Zener diode $Z_1$ and has a high resistance to insure that at most only a tiny fraction of the signal current flows therethrough. An external emitter impedance circuit $R_x$ is provided for the transistor $TR_1$. Resistor $R_6$ of circuit $R_x$ serves to provide the direct-current working point for the transistor $TR_1$, and capacitor $C_4$ is provided with a sufficiently large capacity to present to the alternating-current signal an impedance which may be neglected when compared with the impedance of a variable resistor VR. The alternating-current impedance of the external emitter impedance $R_x$ is therefore that presented by the parallel connection of the resistor $R_6$ and the variable resistor VR. In such a circuit arrangement, the transistors $TR_1$ and $TR_2$ operate in a push-pull arrangement for the alternating-current signal, and the total output signal delivered from the transistors $TR_1$ and $TR_2$ to the output terminal $T_2$ are fed to a load resistor $R_L$, being superposed in the push-pull manner. The terminal $T_3$ is connected to a direct-current power source 19 having a voltage —V.

In general, the input impedance $R_i$ of an amplification circuit having a common emitter or common collector configuration is given by $$R_i=r_b+(1+B)(r_e+R_e) \qquad (1)$$

where $r_b$ is the base resistance of the transistor, B is the current amplification factor which is usually represented by a Greek letter "beta," $r_e$ is the emitter resistance, and $R_e$ is the external emitter resistance. When the base of the transistor is supplied with a base input signal from a signal source supplying a voltage $E_b$ and having an internal impedance $R_b$, the alternating-current component $I_b$ of the base current is given by $$I_b=E_b/(R_b+R_i) \qquad (2)$$

Inasmuch as the base current $I_b$ is much smaller than the collector current $I_c$, the collector current $I_c$ and the emitter current $I_e$ may be assumed to have the same magnitude but opposite polarities and are defined by the following equation:

$$I_c=-I_e=-B\cdot E_b/(R_b+r_b+(B+1)(r_e+R_e)) \qquad (3)$$

Among the constants of a transistor which appear in Equations 1 and 3 above, it should be noted that the emitter resistance $r_e$ is approximately inversely proportional to the emitter current $I_e$ and that the current amplification factor B is non-linearly related to the emitter current $I_e$. Therefore, non-linear distortion of the input signal appears in one or more of the following: the input impedance $R_i$, the emitter current $I_e$, and the collector current $I_c$. It is to be noted here that, in general, the overall input and output non-linear distortion caused by a transistor is about 30 db when the sine-wave output level at the collector is 0 db. Inasmuch as such non-linear distortion introduces grave problems when the input signal is large or when the amplifier is used mainly as an output amplifier, push-pull circuits have been used to remove the distortion.

The present invention operates by applying the above-explained relations to the amplifying circuit including the transistor $TR_1$ of FIGURE 1. If the suffix "1" is added to denote elements associated with the transistor $TR_1$; and if the external emitter resistance $R_e$, the base input voltage $E_b$, and the signal source impedance $R_b$ are replaced respectively by the external emitter impedance $R_x$, the signal voltage $E_s$ and internal impedance $R_s$ of the signal source 10 of the embodiment of FIGURE 1 then the input impedance $R_i1$ and the collector-current alternating-current component $I_c1$ are given by $$R_i1=r_{b1}+(B_1+1)(r_{e1}+R_x) \qquad (4)$$

and $$I_{c1}=-B_1\cdot E_s/(R_s+R_{i1}) \qquad (5)$$

respectively. Inasmuch as either the current amplification factor $B_1$ or the emitter resistance $r_{e1}$ is a function of the emitter current $I_{e1}$, the substitution of $$g(I_{c1})=B_1/(R_s+R_{i1}) \qquad (6)$$

reduces Equation 5 into $$I_{c1}=-g(I_{c1})\cdot E_s \qquad (7)$$

In Equations 6 and 7, the term $g$ is a notation for a function of $I_{c1}$.

Regarding the operation of the transistor $TR_2$ in FIGURE 1, it should be noted that the signal therefor is the output signal of the transistor $TR_1$. Thus, a virtual signal source for the transistor $TR_2$ is provided by the transistor $TR_1$ which has an internal impedance given by the resistor $R_1$, which supplies current $I_{c1}$ and which has voltage $I_{c1}\cdot R_1$. Also, the external emitter resistance $R_e$ in the Equations 1 and 3 above may be replaced with the resistance $R_2$. Therefore, if a suffix "2" is used to denote elements associated with transistor $TR_2$, the input impedance $R_{i2}$ and the emitter-current alternating-current component $I_{e2}$ of the transistor $TR_2$ will be given by $$R_{i2}=r_{b2}+(B_2+1)(r_{e2}+R_2) \qquad (8)$$

and $$I_{e2}=-I_{c2}=B_2\cdot R_1\cdot I_{c1}/(R_1+R_{i2}) \qquad (9)$$

respectively. By substitution in a manner similar to the substitution of Equation 6 into Equation 5 the following equation is obtained:

$$h(I_{c2})=B_2\cdot R_1/(R_1+R_{i2}) \qquad (10)$$

in which the term $h$ is a notation for a function of $I_{c2}$, into Equation 9, the following equation is obtained $$I_{e2}=-h(I_{c2})\cdot g(I_{c1})\cdot E_s \qquad (11)$$

Therefore, the total signal current $I_L$ flowing through the load resistance $R_L$ is given by $$I_L=I_{c1}+I_{e2}=-g(I_{c1})\cdot(1+h(I_{c2}))\cdot E_s \qquad (12)$$

By neglecting the third and higher order terms in the expansion of the right-hand side of the Equation 12, the following equation is obtained $$\begin{aligned} I_L=&-g_0\cdot(1+h_0)\cdot E_s \\ &-g_0\cdot(g_0'\cdot(1+h_0)+g_0\cdot h_0\cdot h_0')\cdot E_s^2 \end{aligned} \qquad (13)$$

where $$g_0=[g(I_{c1})]I_{c1}=0$$
$$g_0'=[\delta g(I_{c1})/\delta I_{c1}=0$$
$$h_0=[h(I_{c2})]I_{c2}=0$$

and $$h_0'=[\delta h(I_{c2})/\delta I_{c2}]I_{c2}=0 \qquad (14)$$

In the right-hand side of the Equation 13, the first and the second terms represent the fundamental-wave and the second-order distortion components, respectively. When the two transistors and other circuit components have characteristics which reduce the second term in the right-hand side of the Equation 13 to zero, or which satisfy $$g_0'(1+h_0)+g_0\cdot h_0\cdot h_0'=0 \qquad (15)$$

then the push-pull amplification circuit provides the desired distortion-free operation. More particularly, transistors, in a push-pull amplifier can operate at good efficiency when the respective transistors supply the same alternating-current output current to the load. Consequently, it is desirable that the output $h_0$ of transistor $TR_2$, correspond with the normalized output of unity of the transistor $TR_1$ (appearing in the first term in the right-hand side of the Equation 13 which represents the fundamental wave component) as follows:

$$h_0=1 \qquad (16)$$

or by the following expression derived from Equations 10 and 14, $$R_2+r_{e2}+r_{b2}/(B_2+1)=R_1(B_2-1)/(B_2+1) \qquad (17)$$

when $I_{c1}=I_{c2}=0$. The conditions of Equation 15 for distortion-free amplification may therefore be rewritten by substituting Equation 16, into $$2g_0'+g_0\cdot h_0'=0 \qquad (18)$$

for $I_{c1}=I_{c2}=0$.

By calculating values for $g_0$ and $g_0'$ from the Equations 4, 6, and 14 and calculating $h_0'$ from Equations 8, 10, and 14, and by utilizing the condition for removal of the second-order distortion of the push-pull amplifier according to the invention (that the collector currents $I_{c1}$ and $I_{c2}$ are both zero for Equation 17) then the following equation is obtained:

$$\begin{aligned} &2[B_1'(R_s+r_{b1}+(B_1+1)(r_{e1}+R_x)) \\ &-B_1((B_1+1)r_{e1}'+(r_{e1}+R_x)B_1')] \\ &\div(R_s+r_{b1}+(B_1+1)(r_{e1}+R_x)) \\ &=B_1\cdot R_1[(R_1+r_{b2}+(B_2+1)(r_{e2}+R_2))B_2' \\ &-B_2((B_2+1)r_{e2}'+(r_{e2}+R_2)B_2')] \\ &\div(R_1+r_{b2}+(B_2+1)(r_{e2}+R_2)^2 \end{aligned} \qquad (19)$$

where $B_1'$, $B_2'$, $r_{e1}'$, and $r_{e2}'$ are defined as follows:

$$B_1' = [\delta B_1/\delta I_{c1}] I_{c1}=0$$
$$B_2' = [\delta B_2/\delta I_{c2}] I_{c2}=0$$
$$r_{e1}' = [\delta r_{e1}/\delta I_{c1}] I_{c1}=0$$
$$r_{e2}' = [\delta r_{e2}/\delta I_{c2}] I_{c2}=0$$

In a special case where transistors $TR_1$ and $TR_2$ have the same characteristics, the subscripts denoting elements associated with the transistors $TR_1$ and $TR_2$ can be omitted and the following equations are obtained:

$$r_{b1}=r_{b2}=r_b$$
$$r_{e1}=r_{e2}=r_e$$
$$B_1=B_2=B$$

and $$I_{c1}=I_{c2}=I_c$$

Then, by using Equation 17, Equation 19 turns into $$(R_x+r_e)(B+1)+R_s+r_b =2B.R_1[1-(R_s+r_b)B'/(r_e'(B+1)^2)] \div[1-r_b.B'/(r_e'(B+1)^2)] \quad (20)$$

wherein the two fractions appearing in the right-hand side enclosed by the respective pairs of square brackets are both considerably smaller than 0.1. This is so because in the transistor used in the amplification circuit (and for $I_c=0$), B is of the order of $3\times10$, $B'=B/I_c$ is of the order of 0.1–1, $r_e'=r_e/I_c$ is of the order of $-1$ through $-3\times10$, $r_b$ is (as will be described hereinafter) 35 ohms or of the order of B (at a working current of for example, of 5 ma.) and $R_s$ is generally scores of ohms or of the order of B. Therefore, the operating conditions for the amplifier where the second-order distortion disappears are as follows:

$$I_c=0 \quad (A)$$

$$R_x+r_e+(R_s+r_b)/(B+1) =2R_1[1-R_s.B'/(r_e'(B+1)^2)] \quad (B)$$

(21)

$$R_2+r_e+r_b/(B+1)=R_1(B-1)/(B+1) \quad (C)$$

where Equation B is derived by expanding the fraction in the right hand side of Equation 20 and where Equation C is derived from the Equation 17.

Figure 2:
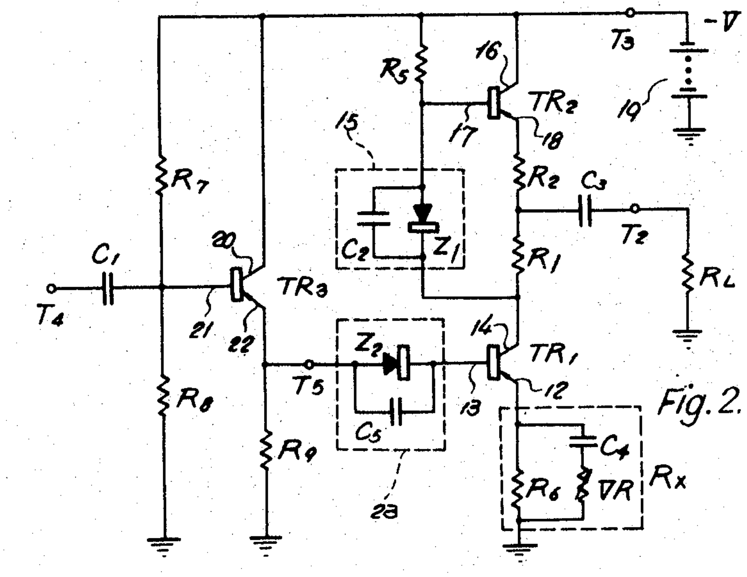
FIGURE 2 is a circuit diagram of another embodiment of the invention using p-n-p transistors.

Referring to FIGURE 2 there is illustrated therein another embodiment of the invention, in which the input signal from a source 10 (not shown) is applied to terminal $T_4$ and passes through a decoupling capacitor $C_1$ to the base 21 of a transistor $TR_3$ whose collector 20 is grounded. The direct-current working point for transistor $TR_3$ is determined by resistors $R_7$ and $R_8$ which have resistances such that little if any signal current flows therethrough. The ouput alternating current from transistor $TR_3$ is derived across a resistor $R_9$ which is connected to the emitter 22, said output current from $TR_3$ is supplied through terminal $T_5$ and a coupling impedance circuit 23 (composed of a Zener diode $Z_2$ for voltage stabilization and a by-pass capacitor $C_5$ connected in parallel) to the base 13 of a transistor $TR_1$. The signal current applied to the base 13 is amplified in the push-pull circuit composed of the transistor $TR_1$ and $TR_2$ which have the same circuit constants as indicated heretofore with reference to FIG. 1, and which produce the output signal across load resistor $R_L$. Equations 21(B and C) also hold for FIG. 2 without any appreciable modification. More particularly, the alternating-current impedance of the circuit to the left of terminal $T_5$ of FIGURE 2 (which corresponds to the input signal impedance $R_s$ appearing in the Equation 21(B)) is equal to the output impedance of the transistor $TR_3$ and is represented by $(r_e+r_b)/B$ when the transistor $TR_3$ is of the same conductivity type as transistors $TR_1$ and $TR_2$ and when the current amplification factor B is very large as compared with unity. Inasmuch as the emitter resistance $r_e$ is (as will be described hereinafter) in the order of several ohms when the working current is, for example 5 ma. and since $r_b$ is of the order of B, then $R_s$ in Equation 21(B) is only several ohms and is very small. Therefore, the value of the third term in the left-hand side of Equation 21(B) $(R_s+r_b)/(B+1)$ is as small as one ohm and is negligible as compared with the sum of the remaining two terms in the left-hand side, $R_x+r_e$, which are about $10^2$ ohms (which will be discussed further hereinafter). Also, the fraction appearing as the second term in the square brackets in the right-hand side of Equation 21(B) is less than $10^{-2}$ and may be neglected as compared with the first term which is unity. The third term in the left-hand side of the Equation 21(C) $r_b/(B+1)$, is of the order of one ohm and may also be neglected as compared with the sum of the first and second terms, $R_2+r_e$, which have a resistance of scores of ohms (which will be discussed further hereinafter). Also, the fraction $(B-1)/(B+1)$ in the right-hand side of Equation 21(C) is approximately equal to unity. Therefore, it is possible to simplify the Equations 21(B) and 21(C) (and particularly Equation 21(B) by using Equation 21(C)). As a result, the condition for this embodiment under which the second order distortion disappears, occurs when $$I_c=0$$

Two very simple equations result from the simplification as follows:

$$R_x=R_1+R_2 \quad (A)$$
$$R_2+r_e=R_1 \quad (B)$$

(23)

It is thus seen that it is feasible to provide a distortion free transistor amplifier of simple construction by utilizing the grounded collector circuit of the transistor $TR_3$ as the input circuit for the push-pull circuit comprising the transistors $TR_1$ and $TR_2$.

In this transistor amplifier (an embodiment of which is illustrated in FIGURE 2) the circuit constants are selected to nullify the second-order distortion and may for example be as follows:

Transistors $TR_1$, $TR_2$, and $TR_3$: 2SA245 ($r_b$=35 ohms; at the working current of 5 ma., $r_e$=5 ohms and B=30)
Zener diode: 1/4M2.4AZ [1] RD–7A (Zener voltages, about 2.4 volts and about 7 volts, respectively)
Resistors (in ohms): $R_1$=47, $R_2$=39, $R_5$=10 kilo, $R_6$=270, $R_7$=6.8 kilo, $R_8$=12 kilo, $R_9$=1 kilo, VR=130, ($R_x$=88, $R_L$=75;
Capacitors (in microfarads): $C_1=C_3=C_4=1000$, $C_2=C_5=68$
Supply voltage —V: —24 volts.

With an amplifier wherein use is made of constants selected in accordance with this invention, measurements have shown that when the sine-wave signal output level at the load resistor $R_L$ is 0 db the second-order distortion is more than 80 db (which value is remarkably good when compared with the previously mentioned value of 30 db for conventional amplifiers of this type). Furthermore, amplifiers constructed in accordance with this invention have been found to provide amplification even at frequencies as high as several megacycles and in a far broader band than conventional amplifiers utilizing a transformer. The amplifier of this invention is therefore capable of operating as a television video amplifier.

Figure 3:
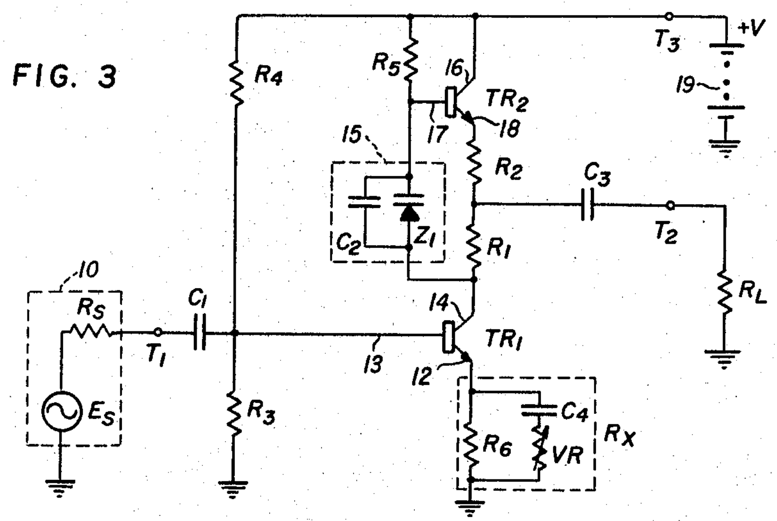
FIGURE 3 is a circuit diagram of the embodiment of FIGURE 1 using n-p-n transistors.
Figure 4:
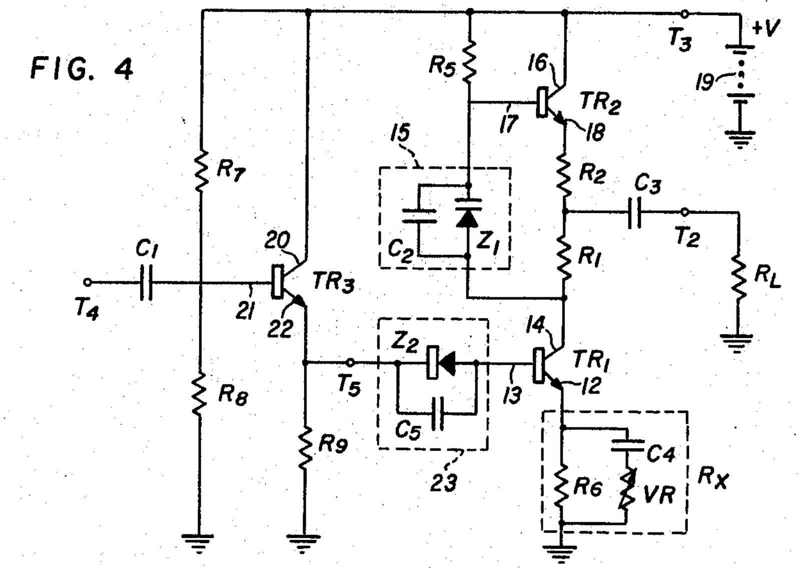
FIGURE 4 is a circuit diagram of the embodiment of FIGURE 2 using n-p-n transistors.

In the embodiments described hereinabove the transistors for push-pull amplification are p-n-p transistors as illustrated in FIGURES 1 and 2. If n-p-n transistors are to be used, the supply voltage would have to be changed from —V to +V and the polarities of the Zener diodes would have to be reversed as illustrated in FIGURES 3 and 4. The variable resistor VR is disposed in the external emitter impedance $R_x$ for adjustment such that the Equation 21(B) may hold even if the characteristics of the transistors $TR_1$ and $TR_2$ may differ slightly from each other. Likewise, the fixed resistor $R_6$ may be

[1] Manufactured by Montrola Corp.

changed to a variable resistor. Furthermore, the Zener diode $Z_1$ in the coupling circuit 15 may be replaecd with a high-resistance resistor, such as 3.3-kiloohm resistor which substitution was actually used in the embodiments.

While we have described above the principles of our invention in connection with specific embodiments, it is to be clearly understood that this description is made only by way of example, and not as a limitation to the scope of our invention as set forth in the objects thereof and in the accompanying claims.

What is claimed is:

1. A transistor alternating current amplifier of push-pull operation comprising:

(A) input signal means for supplying input alternating current signals and having an internal resistance $R_s$; and a direct current voltage source;

(B) a first and a second transistor of common conductivity type each having a base, collector, and emitter electrode;

(C) bias connection means connetcing a first terminal of said power source to said base electrodes for providing a predetermined bias to each transistor for rendering said respective transistors operable, first connection means for supplying the input alternating current signal only to the base electrode of said first transistor, and second connection means for directly connecting the collector electrode of said second transistor to said first terminal of said power source;

(D) coupling means providing a substantially constand voltage drop connected between the base electrode of said second transistor and the collector electrode of the first transistor for supplying signals from said last-mentioned collector electrode to said last-mentioned base electrode;

(E) a first resistor having a resistance $R_1$ and a second resistor having a resistance $R_2$ connected serially between the collector electrode of the first transistor and the emitter electrode of said second transistor, said last-mentioned first resistor $R_1$ being connected to said collector electrode;

(F) an output connected to a point common to said resistor $R_1$ and $R_2$ for receiving the output signals superposed in a push-pull manner from both said transistors;

(G) an impedance circuit having an impedance $R_x$ connected between the emitter electrode of said first transistor and the other terminal of said voltage source;

(H) said resistances $R_1$, $R_2$ and $R_s$ and said impedance $R_x$ having values, when the signal components of said collector currents are assumed to be zero, which satisfy simultaneously both of the following relations:

$$R_2+r_{e2}+r_{b2}/(B_2+1)=R_1(B_2-1)/(B_2+1) \quad \text{(A)}$$

$$\left.\begin{aligned} &2[B_1'(R_s+r_{b1}+(B_1+1)(r_{e1}+R_x)) \\ &\qquad -B_1((B_1+1)r_{e1}'+(r_{e1}+R_x)B_1')] \\ &\qquad \div[R_s+r_{b1}+(B_1+1)(r_{e1}+R_{x1})] \\ &=B_1\cdot R_1[R_1+r_{b2}+(B_2+1)(r_{e2}+R_2)]B_2' \\ &\qquad -B_2[(B+1)r_{e2}'+(r_{e2}+R_2B_2'] \\ &\qquad \div[R_1+r_{b2}+(B_2+1)(r_{b2}+R_2)]^2 \end{aligned}\right\} \text{(B)}$$

where $r_{b1}$ and $r_{b2}$ are the base resistances and $r_{e1}$ and $r_{e2}$ are the emitter resistances respectively of said first and second transistors;

$B_1$ and $B_2$ are the current amplification factors respectively of said transistors;

$r_{e1}'$ and $r_{e2}'$ are the first derivatives of said emitter resistance taken respectively with respect to the alternating collector current in the associated transistor and where $B_1'$ and $B_2'$ are the first derivatives of said amplification factors taken with respect to the alternating collector currents in the first and second transistors, respectively; whereby said last-mentioned first derivatives constituting second order distortion which is substantially eliminated from said output signals in said output thereby providing substantially distortion free amplification in said push-pull amplifier.

2. A transistor amplifier as set forth in claim 1 wherein the characteristics of said first and second transistors are substantially equal to each other such that $$r_{b1}=r_{b2}=r_b=r_{e1}=r_{e2}=r_e$$
$$B_1=B_2=B$$

whereby each of said current amplification factors $B_1$ and $B_2$ of said first and second transistors, respectively, is equal to the other and to current amplification of factor B of the overall push-pull amplifier and wherein $R_1$, $R_2$, $R_s$ and $R_x$ have resistance values which satisfy the following simplified relations:

$$R_2+r_e+r_b/(B+1)=R_1(B-1)/(B+1) \quad \text{(A–1)}$$

$$R_x+r_e+(R_s+r_b)/(B+1) =2R_1[1-R_s\cdot B'/(r_e'(B+1)^2] \quad \text{(B–1)}$$

for substantially eliminating said second order distortion from said output signals in said output.

3. A transistor amplifier as set forth in claim 1 wherein said input signal means supplies an alternating current signals and said first connection means comprises a third transistor having a conductivity like said common conductivity of said first and second transistors and including base, collector and emitter electrodes, said last-mentioned base electrode connected to said signal means to receive the alternating signals therefrom, impedance means connected between said last-mentioned emitter electrode and said other terminal of said voltage source, and said last-mentioned collector electrode directly connected to said first terminal of said voltage source, and second coupling means for connecting a point common to said last-metioned emitter electrode and impedance means to the base electrode of said first transistor.

4. A transistor amplifier as set forth in claim 1 wherein said input signal means supplies an alternating current signals and said first connection means comprises a third transistor having a conductivity like said common conductivity of said first and second transistors and including base, collector and emitter electrodes, said last-mentioned base electrode connected to said signal means to receive said alternating current signals therefrom, impedance means connected between said last-mentioned emitter electrode and said other terminal of said voltage source, and said last-mentioned collector electrode directly connected to said first terminal of said voltage source, and second coupling means for coupling a point common to said last-mentioned emitter electrode and impedance means to said base electrode of said first transistor.

5. A transistor amplifier as set forth in claim 2 wherein the resistors $R_1$, $R_2$, $R_s$ and $R_x$ have resistances which approximately satisfy the following relations $$R_x=R_1+R_2 \quad \text{(A–2)}$$
$$R_1=R_2+r_e \quad \text{(B–2)}$$

as factors for substantially eliminating second order distortion from said signals in said output.

6. A transistor amplifier as set forth in claim 3 wherein the resistors $R_1$, $R_2$, $R_s$ and $R_x$ have resistance values which satisfy the following relation $$R_x=R_1+R_2 \quad \text{(A–2)}$$
$$R_1=R_2+r_e \quad \text{(B–2)}$$

as factors for substantially eliminating second order distortion from said signals in said output.

7. A transistor amplifier as set forth in claim 1 wherein said coupling means comprises a Zener diode in parallel with a capacitor.

8. A transistor amplifier as set forth in claim 3 wherein said second coupling means comprises a Zener diode connected in parallel with a capacitor.

9. A transistor amplifier as set forth in claim 1 wherein said impedance circuit comprises a resistor connected in parallel with a series R–C circuit.

10. A transistor amplifier as set forth in claim 3 wherein said impedance circuit comprises a resistor connected in parallel with a series R–C circuit.

11. A transistor amplifier as set forth in claim 1 wherein said first and second transistors of common conductivity type are of the n-p-n type.

12. A push-pull transistor amplifier as set forth in claim 1 wherein said first and second transistors of common conductivity type are of the p-n-p type.

13. A transistor amplifier of push-pull operating type comprising:

two transistors of common conductivity type, each having a base, a collector and an emitter, a supply of alternating current signals, a source of direct current voltage, first means connecting one terminal of said voltage source to said bases for biasing said two transistors into operation, a constant voltage network including a diode and a capacitor in parallel coupling said collector of one of said two transistors to said base of the other of said two transistors, said diode having a substantially constant voltage drop for large variations of current flow therethrough, an R–C network coupling said emitter of said one transistor to a second terminal of said voltage source, second means directly connecting said collector of said other transistor to said one terminal of said voltage source, third means coupling said signal supply to said base of said one transistor, two resistors serially connected between said one transistor collector and other transistor emitter, one of said two resistors having a free end connected to said one transistor collector and a second of said two resistors having a free end connected to said other transistor emitter, and an output connected to a point common to said two resistors for receiving output signals in a push-pull manner from said two transistors.

14. The push-pull amplifier according to claim 13 in which said third means comprises a third transistor having a conductivity the same as said common conductivity of said two transistors and including a base, a collector and an emitter, said last-mentioned base coupled to said signal supply, said last-mentioned collector directly connected to said one terminal of said voltage source, impedance means connecting said last-mentioned emitter to said other terminal of said voltage source, and a second constant voltage network including a diode and a capacitor in parallel coupling a point common to said last-mentioned emitter and impedance means to said base of said one transistor, said last-mentioned diode having a substantially constant voltage drop for large variations of current flow therethrough.

15. A transistor amplifier of push-pull operating type comprising:

two transistors of common conductivity type, each having a base, a collector and an emitter, a supply of alternating current signals, a source of direct current voltage, first means connecting one terminal of said voltage source to said bases for biasing said transistors into operation, a first constant voltage network including a diode and a capacitor in parallel coupling said collector of one of said two transistors to said base of the other of said two transistors, said diode having a substantially constant voltage drop for large variations of current flow therethrough, second means directly connecting said collector of said other transistor to said source one terminal, third means coupling said signal supply to said base of said one transistor, said last-mentioned means comprising a third transistor having a conductivity like said common conductivity of said two transistors and including a base, a collector and an emitter, said last-mentioned base coupled to said signal supply, said last-mentioned collector directly connected to said one terminal of said voltage source, impedance means connecting said last-mentioned emitter to another terminal of said voltage source, and a second constant voltage network including a diode and a capacitor in parallel coupling a point common to said last-mentioned emitter and impedance means to said base of said one transistor, an R–C network coupling said emitter of said one transistor to said other terminal of said voltage source, two resistors serially connected between said collector of said one transistor and said base of said second transistor, one of said two resistors having a free end connected to said collector of said one transistor and a second of said two resistors having a free end connected to said emitter of said other transistor, and an output connected to a point common to said two resistors for receiving output signals in a push-pull manner from said two transistors.

16. The amplifier according to claim 15 in which said three transistors are a p-n-p type.

17. The amplifier according to claim 15 in which said diodes in said first and second constant voltage networks are semiconductor elements.

References Cited

UNITED STATES PATENTS

| | | | |
|---|---|---|---|
| 2,934,641 | 4/1960 | Lin | 330—15 X |
| 3,001,144 | 9/1961 | Dandl | 330—18 X |
| 3,040,265 | 6/1962 | Forge | 330—24 X |
| 3,086,177 | 4/1963 | Beers et al. | 330—18 |
| 3,114,112 | 12/1963 | Cochran | 330—17 |
| 3,124,758 | 3/1964 | Bellamy et al. | 330—18 |
| 3,215,946 | 11/1965 | Likel | 330—18 |

FOREIGN PATENTS

| | | |
|---|---|---|
| 1,143,859 | 2/1963 | Germany. |

ROY LAKE, *Primary Examiner.*

F. D. PARIS, J. B. MULLINS, *Assistant Examiners.*

UNITED STATES PATENT OFFICE
CERTIFICATE OF CORRECTION

Patent No. 3,328,713 June 27, 1967

Sukehiro Ito et al.

It is hereby certified that error appears in the above numbered patent requiring correction and that the said Letters Patent should read as corrected below.

Column 2, line 43, for "capaictor" read -- capacitor --; column 4, line 27, for "$(I_c i)$" read -- $(I_c 1)$ --; line 28, after "$I_c 1$", second occurrence, insert -- $]I_c 1$ --; line 75, for "$R_2)^2$" read -- $R_2))^2$ --; column 6, line 46, for "75;" read -- 75); --; column 7, line 2, for "replaecd" read -- replaced --; line 20, for "connetcing" read -- connecting --; lines 30 and 31, for "constand" read -- constant --; lines 40 and 41, strike out "said last-mentioned first resistor $R_1$ being connected to said collector electrode;" and insert instead -- said first resistor $R_1$ being connected to said last-mentioned collector electrode; --; line 61, for "(B+1)" read -- $(B_2+1)$ --; same line 61, for "$R_2B'_2$" read -- $R_2)B'_2$ --; line 62, for "$(r_{b2}+R_2)$" read -- $(r_{e2}+R_2)$ --; column 8, line 27, for the claim reference numeral "1" read -- 2 --; lines 28 and 43, strike out "an", each occurrence.

Signed and sealed this 17th day of September 1968.

(SEAL)
Attest:

EDWARD M.FLETCHER,JR.
Attesting Officer

EDWARD J. BRENNER
Commissioner of Patents